(12) United States Patent
Shinohara et al.

(10) Patent No.: US 6,593,593 B2
(45) Date of Patent: Jul. 15, 2003

(54) TRANSPARENT ELECTRODE COMPRISING ZNO AND A FILM WITH A MELTING POINT LOWER THAN THAT OF ZNO

(75) Inventors: Wataru Shinohara, Katano (JP); Yasuaki Yamamoto, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/752,517

(22) Filed: Jan. 3, 2001

(65) Prior Publication Data

US 2001/0053560 A1 Dec. 20, 2001

(30) Foreign Application Priority Data

Jan. 11, 2000 (JP) ........................................ 2000-002141
Dec. 22, 2000 (JP) ........................................ 2000-390983

(51) Int. Cl.⁷ ............................................. H01L 29/15
(52) U.S. Cl. ........................... 257/72; 257/59; 257/750; 428/699; 428/701; 428/702
(58) Field of Search .......................... 257/59, 72, 99, 257/432, 750

(56) References Cited

U.S. PATENT DOCUMENTS

| | | | | | |
|---|---|---|---|---|---|
| 4,663,495 A | * | 5/1987 | Berman et al. | ......... | 114/201 R |
| 5,981,864 A | * | 11/1999 | Mizutani et al. | ............. | 136/244 |
| 6,208,404 B1 | * | 3/2001 | Tomoyori et al. | ........... | 349/106 |
| 6,239,536 B1 | * | 5/2001 | Lakin | ......................... | 310/364 |

* cited by examiner

*Primary Examiner*—Amir Zarabian
*Assistant Examiner*—Jamie L. Brophy
(74) *Attorney, Agent, or Firm*—Arent Fox Kintner Plotkin & Kahn, PLLC

(57) ABSTRACT

This invention provides a patterning method for a transparent electrode capable of preventing heat damages and insulation failure or the like even when a ZnO film is used. An ITO film 3 is formed on a transparent substrate 1 by sputtering and the ZnO film 4 is formed on the ITO film 3 by sputtering. Then, regions to be irradiated of the ITO film 3 and the ZnO film 4 are eliminated and patterned by Nd-YAG laser irradiation.

3 Claims, 20 Drawing Sheets

TRANSPARENT ELECTRODE COMPRISING ZNO AND A FILM WITH A MELTING POINT LOWER THAN THAT OF ZNO

BACKGROUND OF THE INVENTION

1. Field of the Invention

This invention relates to a transparent electrode, a patterning method for the same, and a manufacturing method for a semiconductor element of the same formed on a transparent substrate used in an integrated type photovoltaic device, a liquid crystal display device, and an organic EL device or the like.

2. Description of the Prior Art

A photovoltaic device comprising an amorphous semiconductor of amorphous silicon, amorphous silicon carbide, amorphous silicon germanium or the like has been developed as a solar cell device because it is manufactured at low cost and easily increases in size.

Explanation of a general amorphous photovoltaic device is made by referring to FIG. 35. A photovoltaic element 100 of an amorphous semiconductor is formed by laminating a transparent electrode 102, a photovoltaic conversion layer 103 of a lamination of p-, i-, and n-type amorphous semiconductor layers 103p, 103i, 103n, and a rear surface metal electrode 104 in this order on a glass substrate 101.

Tin oxide ($SnO_2$) and ITO (Indium Tin Oxide) are used conventionally as transparent conductive material for forming the transparent electrode 102. In recent years, zinc oxide (ZnO) has been examined in order to reduce manufacturing cost and provide a photovoltaic element having high photovoltaic characteristics.

A photovoltaic element using ZnO is manufactured by the following processes. For example, a transparent electrode 102 of ZnO is formed on a glass substrate 101 by sputtering, and a photovoltaic conversion layer 103 formed of a lamination of a p-type layer 103p of approximately 150 Å of p-type amorphous silicon carbide, an i-type layer 103i of approximately 4000 Å of i-type amorphous silicon, and an n-type layer 103n of approximately 200 Å of n-type amorphous silicon is formed by plasma CVD. Then, a rear surface metal electrode 104 of silver (Ag) is sequentially laminated by sputtering to manufacture the photovoltaic element 100.

Photovoltaic elements including transparent electrodes 102 of ZnO of various thickness are manufactured and the photovoltaic conversion efficiency of them are measured. The results are shown in FIG. 36. As shown in a characteristic diagram of FIG. 36, high photovoltaic conversion efficiency over 10.5% is obtained when a thickness of the transparent electrode 102 is approximately 2100–5000 Å.

The photovoltaic element using the transparent electrode of ZnO can provide high photovoltaic conversion efficiency.

The photovoltaic device comprising the amorphous semiconductor has an integrated structure so as to take out a high voltage from a single substrate.

In order to form the integrated structure, it is necessary to separate the transparent electrode film, the amorphous semiconductor layer, and the metal electrode film on the glass substrate. A laser patterning method is used for the separation.

A structure of a laser patterning device is explained by referring to FIG. 37. A laser 11 emitted from an Nd:YAG laser oscillating device 10 changes its direction at a reflection mirror 12, is condensed by a condensing lens 13, and irradiates a region to be processed of an object to be processed 20 mounted on a moving table 14 of an XYZ stage. A pattern is controlled by moving the moving table 14 with the object to be processed 20 mounted thereon.

In patterning a transparent electrode by using this device, the transparent substrate 21 with the transparent electrode film 22 formed on the whole surface thereof as the object to be processed is mounted on the moving table 14. The moving table 14 is controlled to move in XYZ directions so that the region to be processed of the transparent electrode 22 is eliminated by laser as shown in FIG. 38.

In the meantime, when the ZnO film formed by sputtering as the transparent electrode on the transparent substrate (a glass substrate) 21 is laser-patterned by an Nd:YAG laser (a wavelength of 1064 nm, power 10W, and a beam diameter 50 μm), phenomena particular to the ZnO film, which is not observed when using material such as $SnO_2$ and ITO as the transparent electrode, are found. That is, (1) volume expansion of a laser irradiated end part, (2) a crack of a laser irradiated end part, (3) peeling of the ZnO film from the glass substrate, (4) diffusion of a ZnO forming element into the glass substrate, or the like.

These phenomena seem to complicatedly relate to a crystalline structure, heat conductivity, a surface tension in melting or the like of ZnO material. These phenomena may result in short-circuit between electrodes of the photovoltaic device, degraded reliability of the photovoltaic device, separation failure of the ZnO film (insulation failure between adjacent photovoltaic elements), and these problems obstruct commercialization of the ZnO material. The photovoltaic element using the transparent electrode of the ZnO film can not provide sufficient characteristics as an integrated type photovoltaic device while it can provide high photovoltaic conversion efficiency.

It is generally known that the ZnO material has moisture absorption property. Therefore, when the ZnO film is retained in an atmosphere over a day, moisture in the atmosphere penetrates from a surface of the ZnO film and solid state properties change, resulting in significant failure of laser patterning.

FIG. 39 is results of temperature distribution simulation in laser patterning; an Nd:YAG laser (wavelength 1064 nm, power 10W, a beam diameter 50 μm) is irradiated to an aluminum dope ZnO film(7500 Å in thickness) formed on a glass substrate by sputtering. In this simulation, it is assumed that laser energy injected to the ZnO film (laser energy excluding reflection and transmission loss) is converted into heat energy.

The laser-irradiated ZnO film is required to be evaporated (scattered) with the temperature reaching over the melting point and be completely eliminated so as to obtain complete electrical insulation by laser patterning. The ZnO film is required to melt to an interface of the glass and the ZnO film completely. In this case, a temperature of the ZnO film on a surface side reaches over the melting point and is in a high temperature state.

The excessive energy not only is converted into kinetic energy of a ZnO molecule but also moves to a periphery of a laser irradiated part by heat conduction, resulting in following heat damages; (1) volume expansion of the laser irradiated end part, (2) a crack of the laser irradiated end part, (3) peeling of the ZnO film from the glass substrate, (4) diffusion of the ZnO forming element in the glass substrate.

These problems may cause short-circuit passing through a semiconductor layer later formed, or a crack generated in the ZnO film in other processes may cause loss of a part of the film and degradation of reliability. In addition, diffusion of component elements of the ZnO film to the glass substrate causes separation failure (electrical insulation failure).

The above simulation is made in assumption that all laser energy is converted into heat energy. However, in actually dividing the ZnO film into a plurality of electrodes by laser patterning, absorption of a laser is insufficient when the ZnO film is thin, resulting in incomplete electrical separation.

A ZnO film having various thickness is formed on a glass substrate, and is divided into two electrodes by laser patterning. Then resistance between the two electrodes is measured. FIG. 40 is a characteristic view showing relations between a thickness of the ZnO film and yields of non-defective item having resistance between the electrodes not less than 10MΩ.

A separation width of the two electrodes is approximately 100 μm as in the case of using for a photovoltaic device. It is found that high yields of over 90% can be obtained when a thickness of the ZnO film is larger than 5000 Å but as a thickness becomes small, the yield declines. When the thickness is smaller than 4500 Å, yields is as low as under 40%.

The measurements show whether the film is completely separated depending on resistance between the electrodes. When the thickness is large, as shown in FIG. 39, a temperature on a surface of the ZnO film is far higher than the melting point and deficiency particular to the ZnO film may occur. Therefore, when the ZnO film with merely a large thickness is used as a transparent electrode of the photovoltaic device, degradation of characteristics and reliability may occur.

SUMMARY OF THE INVENTION

This invention was made to use a transparent electrode film for a photovoltaic device of a ZnO film (gallium dope ZnO and aluminum dope ZnO) film which is manufactured at low cost as compared with conventionally used $SnO_2$, ITO or the like. In addition, this invention was made to provide a transparent electrode and a manufacturing method thereof capable of preventing phenomena (heat damages, insulation failure or the like) particular to the ZnO film appearing in a laser patterning process for forming the integrated type photovoltaic device.

A transparent electrode according to this invention is formed by patterning a transparent electrode film formed on a transparent substrate with a laser, and comprises a transparent electrode film having a lower melting point than that of a ZnO film and the ZnO film laminated in this order on the transparent substrate.

As described above, the transparent electrode having a lower melting point is provided on a side apart from the surface to be irradiated with a laser, thus injection of excessive laser energy higher than the melting point of the material becomes unnecessary, resulting in suppression of heat damage (volume expansion, a crack) on the end part to be irradiated with a laser.

An ITO film may be used as a transparent electrode film having a lower melting point than that of the ZnO film.

Because the melting point of the ITO film is lower than that of the ZnO film, excessive laser energy higher than the melting point of the material becomes unnecessary, resulting in suppression of heat damage of a laser irradiated end part.

The ITO film may be 100–1000 Å, and the ZnO film may be 2500–5000 Å.

With this structure, good conversion efficiency and a good release voltage are obtained from a photovoltaic device using this transparent electrode.

The transparent electrode film having the lower melting point than that of the ZnO film is a metal thin film.

The metal thin film may be formed of silver and is 50–300 Å.

With this structure, good conversion efficiency and a good release voltage are obtained from a photovoltaic device using this transparent electrode.

The metal thin film is formed of aluminum and is 50–100 Å.

With this structure, good conversion efficiency and a good release voltage are obtained from a photovoltaic device using this transparent electrode.

A moisture proof layer containing nitrogen may be formed on a surface of the ZnO film.

The moisture proof layer prevents moisture from penetrating from a surface of the ZnO film so that workability of laser-patterning is not degraded. In addition, long-term reliability of the ZnO film is improved.

In a patterning method for a transparent electrode according to this invention, a transparent electrode film having a lower melting point than that of a ZnO film is formed on a transparent substrate, a ZnO film is formed on the transparent electrode film, and regions to be irradiated of the transparent electrode film and the ZnO film are eliminated and patterned by laser irradiation.

As described above, the transparent electrode having a lower melting point is provided on a side apart from the surface to be irradiated with a laser, thus injection of excessive laser energy higher than the melting point of the material becomes unnecessary, resulting in suppression of heat damage (volume expansion, a crack) on the end part to be irradiated with a laser.

A moisture proof layer containing nitrogen is formed on a surface of the ZnO film.

The moisture proof layer prevents moisture from penetrating from a surface of the ZnO film so that workability of laser-patterning is not degraded. In addition, long-term reliability of the ZnO film is improved.

An ITO film as the transparent electrode film having the lower melting point than that of the ZnO film is formed by sputtering.

The transparent substrate is a glass substrate and a crystallized glass layer is provided between the glass substrate and the ITO film.

The crystallized glass layer prevents the ZnO component element from diffusing to the glass substrate in laser-patterning.

The ITO film may be 100–1000 Å, and the ZnO film may be 2500–5000 Å.

With this structure, good conversion efficiency and a good release voltage are obtained from a photovoltaic device using this transparent electrode.

The transparent electrode film having the lower melting point than that of the ZnO film may be a metal thin film.

The metal thin film is formed of silver and is 50–300 Å.

With this structure, good conversion efficiency and a good release voltage are obtained from a photovoltaic device using this transparent electrode.

The metal thin film is formed of aluminum and is 50–100 Å.

With this structure, good conversion efficiency and a good release voltage are obtained from a photovoltaic device using this transparent electrode.

A manufacturing method for a semiconductor element according to this invention comprises a process for forming a transparent electrode film having a lower melting point than that of a ZnO film on a transparent substrate and forming a ZnO film on the transparent electrode film, a process for forming a plurality of transparent electrodes on the transparent substrate by irradiating laser on the ZnO film and eliminating and patterning regions to be irradiated of the transparent electrode film and the ZnO film, a process for forming a photovoltaic conversion layer of an amorphous semiconductor on the transparent substrate with the plurality of divided transparent electrodes included, and a process for forming a highly reflective conductive film on the photovoltaic conversion layer.

The manufacturing method for the semiconductor element according to this invention further comprises a process for separating the previously formed photovoltaic conversion layer into a plurality of photovoltaic conversion layers by laser irradiation, and a process for dividing into a plurality of electrodes by laser irradiation to the previously formed highly reflective conductive film.

Through these processes, good conversion efficiency and a good release voltage are obtained from a photovoltaic device using this transparent electrode.

The foregoing and other objects, features, aspects and advantages of the present invention will become more apparent from the following detailed description of the present invention when reviewed in conjunction with the accompanying drawings.

DESCRIPTION OF THE PREFERRED EMBODIMENTS

Embodiments of this Invention are Explained.

A ZnO film (gallium doped ZnO, and aluminum dope ZnO) of lower cost material than $SnO_2$ and ITO or the like used conventionally is used as a transparent electrode film for a photovoltaic device according to this invention. Heat damage on the ZnO film in a laser patterning process for forming an integrated type photovoltaic device results from excessive injection of heat energy higher than a melting point.

Figure 1:
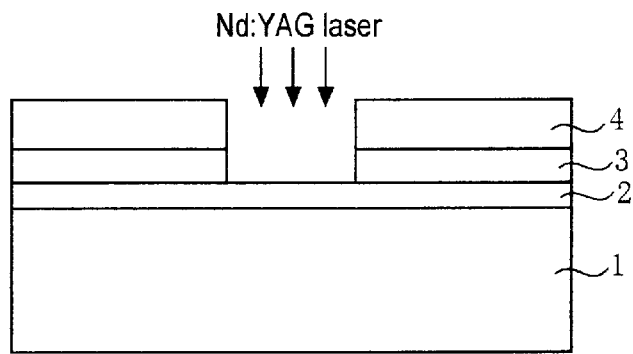
FIG. 1 is a cross sectional view illustrating a transparent electrode according to this invention.

This invention provides a transparent electrode capable of laser-patterning without injecting excessive heat energy higher than the melting point. As shown in FIG. 1, the transparent electrode is provided with a crystallized glass ($Li_2O$—$Al_2O_3$—$SiO_2$) layer 2 on a transparent glass substrate 1, and an ITO film 3 and a ZnO film 4 are laminated on the crystallized glass 2 by sputtering. The ITO film has a lower melting point than that of the ZnO film. Because the ITO film having the lower melting point is provided on a side far from a surface to be irradiated with a laser, injection of excessive laser energy higher than the melting point of material becomes unnecessary and heat damage on the laser irradiated end part (volume expansion, a crack) is suppressed.

The crystallized glass ($Li_2O$—$Al_2O_3$—$SiO_2$) layer 2 formed on an interface of the glass substrate 1 and the transparent electrode film prevents the ZnO component element from diffusing to the glass substrate 1.

Figure 2:
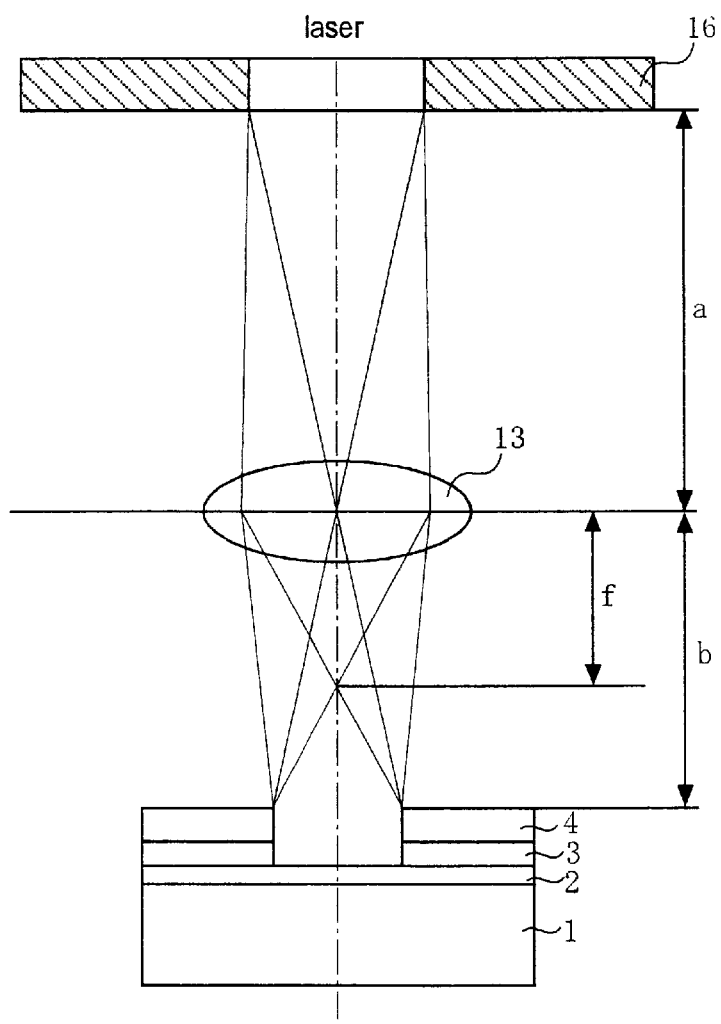
FIG. 2 is a partially enlarged view illustrating an optical system of a laser-irradiated part according to this invention.

The laser used in this embodiment is an Nd-YAG laser (a wavelength 1064 nm, power 8W, a beam diameter 50 μm), and is shaped so as to have an approximately uniform energy distribution to a region to be irradiated by using an optical system shown in FIG. 2. An iris 16 (a round or rectangular hole) having an aperture rate of approximately 25% to an incident diameter from a center part of the laser is arranged on an optical path of a general laser having normal energy distributions, the laser passing though the iris 16 is introduced to the condensing lens 13, the laser condensed by the condensing lens 13 is irradiated to an object to be processed on the basis of the conditions of the formula (1).

$$1/a + 1/b = 1/f \qquad (1)$$

a: a distance from an iris to a center of a condensing lens
b: a distance from a center of a condensing lens to a surface of an object to be processed
f: a focal length of a condensing lens With this structure, excessive heat given to a region except a region to be eliminated (particularly, a peripheral region of the processed part) is reduced, resulting in heat damage.

Figure 39:
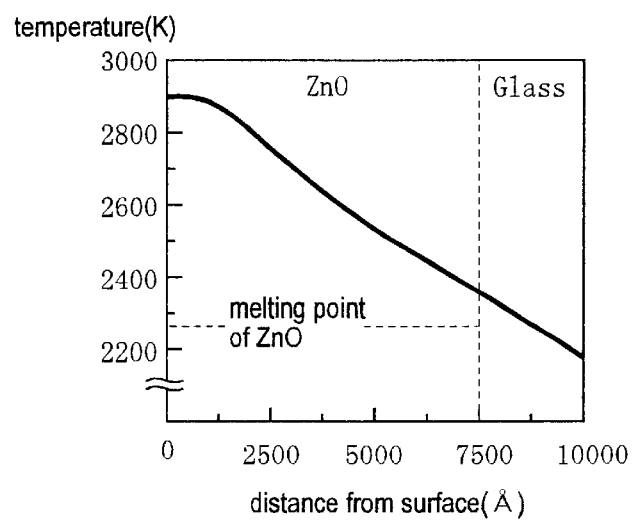
FIG. 39 is a temperature distribution simulation of laser irradiation power in patterning the conventional transparent electrode with an Nd-YAG laser.

As the number of lamination of transparent electrode films is large, melting point distributions close to actual temperature distributions can be achieved. However, a transparent electrode film of a general photovoltaic device is 5000–10000 Å in thickness and temperature gradient of more than 500K occurs in the film when such the transparent electrode film is laser-patterned. FIG. 39 shows results of a temperature distribution simulation in forming the transparent electrode film of only the ZnO film and it is found that temperature gradient of more than 500K occurs in the conventional film.

Figure 4:
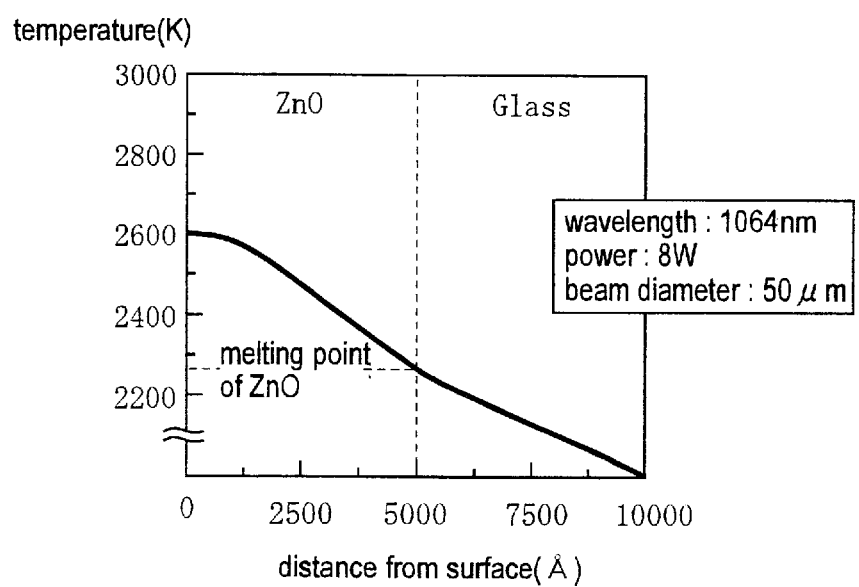
FIG. 4 shows a temperature distribution simulation of laser irradiation power in patterning the transparent electrode with an Nd:YaG laser.
Figure 5:
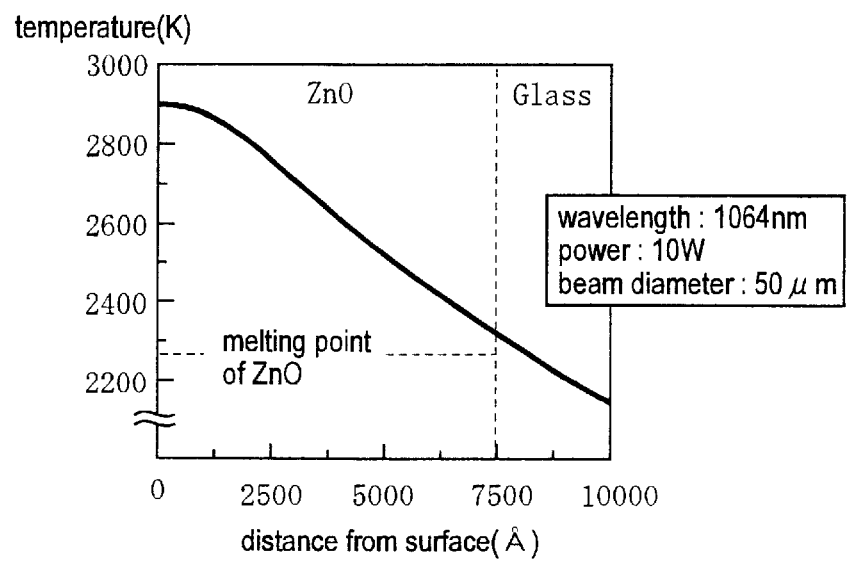
FIG. 5 shows a temperature distribution simulation of laser irradiation power in patterning the transparent electrode with an Nd:YaG laser.
Figure 6:
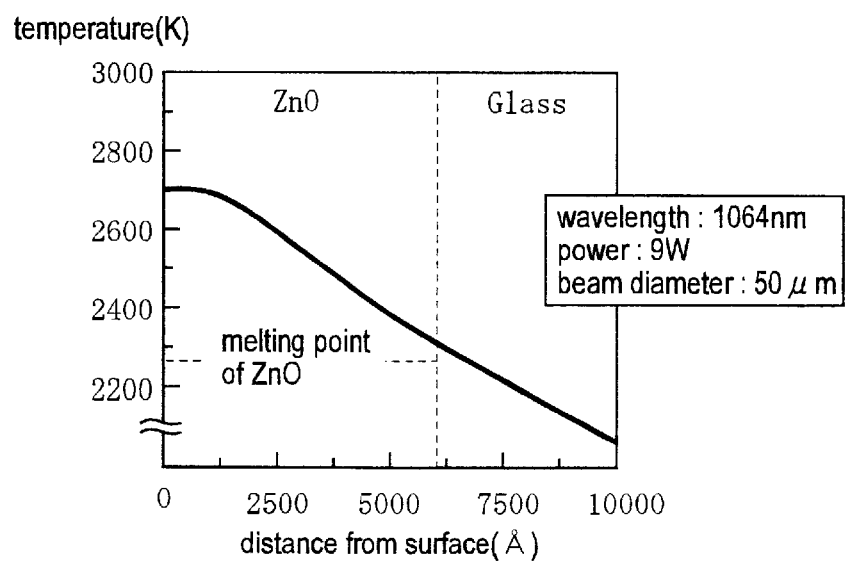
FIG. 6 shows a temperature distribution simulation of laser irradiation power in patterning the transparent electrode with an Nd:YaG laser.

FIGS. 4, 5, 6 show results of a temperature distribution simulation of laser irradiation power optimized for each of three patterns of thickness of the aluminum dope ZnO film. In this case, an optimizing condition is to control a temperature of an interface of the glass and the ZnO film to be higher than a melting point 2248K.

An Nd:YaG laser in FIG. 4 has a wavelength 1064 nm, power 8W, and a beam diameter 50 μm. Heat damage is not generated in FIG. 4, but is generated in FIGS. 5, 6. An Nd:YaG laser in FIG. 5 has a wavelength 1064 nm, power 10W, and a beam diameter 50 μm. An Nd:YaG laser in FIG. 6 has a wavelength 1064 nm, power 9W, and a beam diameter 50 μm.

In FIGS. 4–6, a difference between temperatures on surface parts, or a temperature difference between the surface temperature and the melting point, seems approximately 350K under the conditions for not generating heat damage. It is preferred to form of at least two transparent electrode films and have a thickness of each of the layers not larger than 5000 Å so as to suppress the temperature difference on the surface part within approximately 350K.

Figure 3:
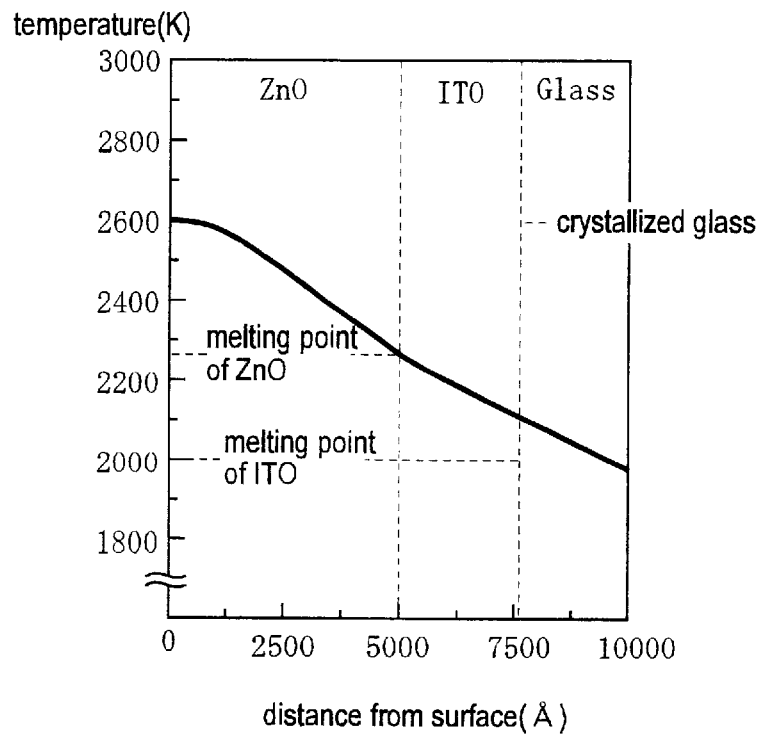
FIG. 3 shows a temperature distribution simulation of laser irradiation power in patterning the transparent electrode according to this invention with an Nd:YaG laser of a wavelength 1064 nm, power 8W, and a beam diameter 50 $\mu$m.

A crystallized glass layer 2 of 50 Å is formed on a transparent glass substrate 1, an ITO film 3 of 2500 Å and a ZnO film of 5000 Å are formed in this order on the crystallized glass layer 2. FIG. 3 shows a temperature distribution simulation of laser irradiation power in patterning with an Nd:YAG laser (a wavelength 1064 nm, power 8W, a beam diameter 50 μm). In the transparent electrode film of this invention formed as described above, a temperature disparity on a surface part of the ZnO film 4, or a temperature difference between the surface temperature and the melting point, is within approximately 350K. At this time, the ITO film 3 on an interface between the crystallized glass layer 2 and the ITO film 3 has a higher temperature than the melting point and patterning is provided without heat damage.

When the transparent electrode of this embodiment is used as a transparent electrode of an integrated photovoltaic device, sheet resistance and light transmittivity of the transparent electrode should be considered.

Figure 36:
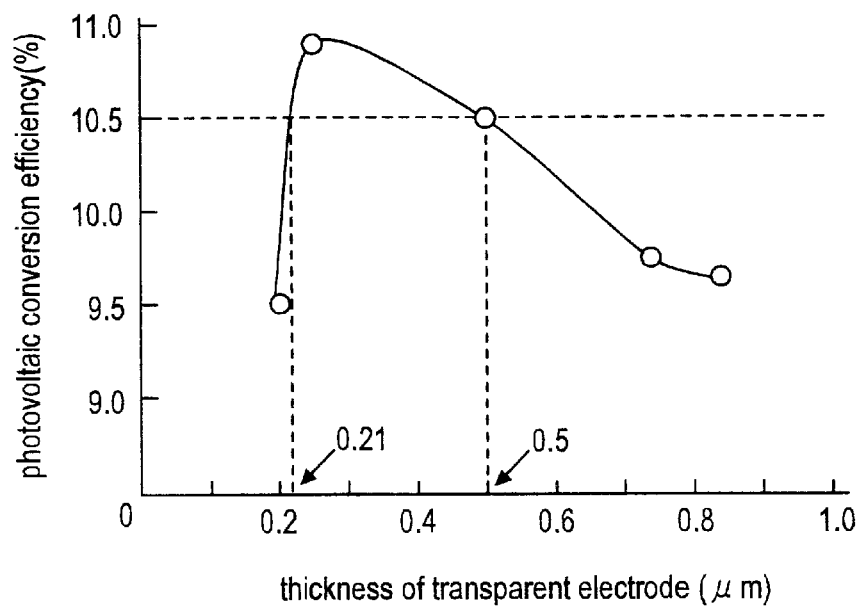
FIG. 36 is a characteristic view indicating relations between a thickness of the transparent electrode and photovoltaic conversion efficiency of the photovoltaic element using the transparent electrode of the ZnO film.
Figure 37:
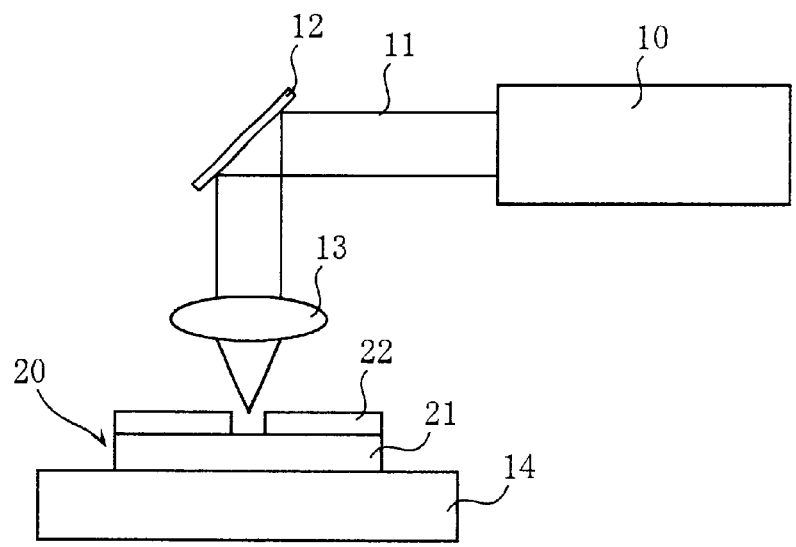
FIG. 37 is a schematic view illustrating a structure of a laser patterning device.
Figure 38:
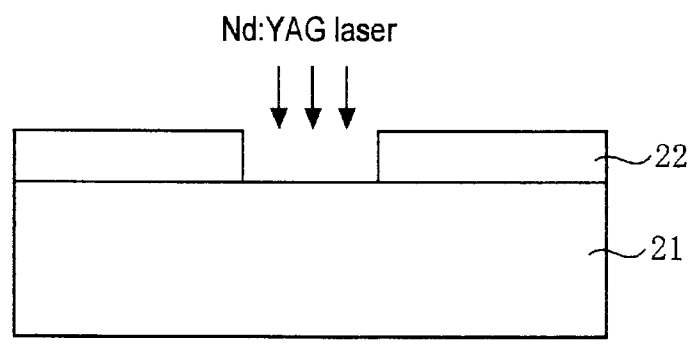
FIG. 38 is a cross sectional view illustrating a conventional transparent electrode.
Figure 40:
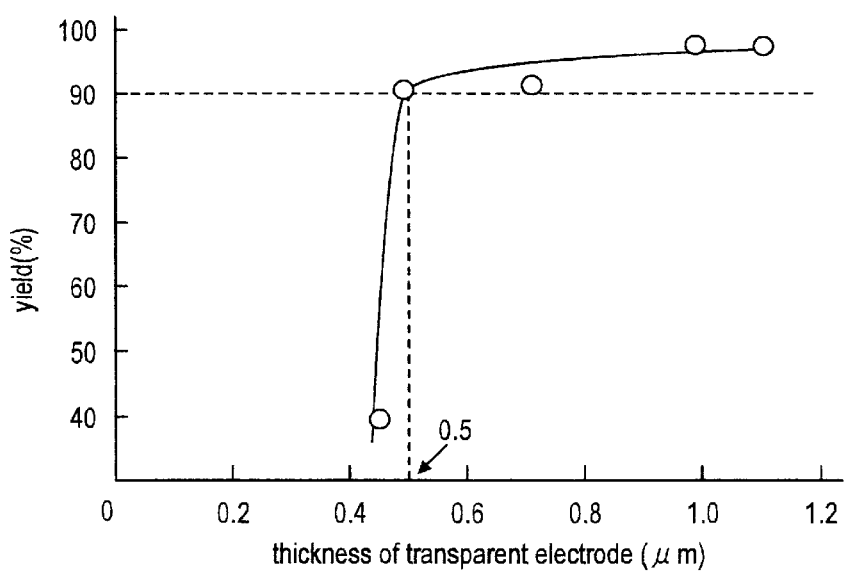
FIG. 40 is a characteristic view illustrating relation between a thickness and yield when the ZnO film is used as the transparent electrode.

A thickness of the ZnO film is preferred to be not more than 5000 Å in order to provide patterning without heat damage as shown in FIGS. 4–6. As shown in FIG. 36, the photovoltaic element using the ZnO film as the transparent electrode can obtain high photovoltaic efficiency when the thickness of the ZnO film is approximately 2100–5000 Å. A film formed by laminating the ZnO film and other transparent electrode films is preferred to have a thickness of approximately 2100–5000 Å when the ZnO is used as main material for the transparent electrode film. However, when the transparent electrode film is formed of the ZnO element film, yields after divining the film by laser-patterning declines significantly when the thickness is not larger than 4500 Å as shown in FIG. 40.

A crystallized glass layer 2 of 50 Å is provided on a transparent glass substrate 1, an ITO film 3 and a ZnO film 4 are formed in this order on the crystallized glass substrate 2. Thickness of each of the films is varied and patterned with an Nd:YAG laser (a wavelength 1064 nm, power 8W, a beam diameter 50 μm). An integrated type photovoltaic device is manufactured by using this substrate. This integrated type photovoltaic device is formed as follows. The substrate is laser-patterned to divide into a plurality of transparent electrodes on the transparent glass substrate 1 and p-, I-, n-types amorphous semiconductor layers are laminated in this order on an approximately whole surface on the substrate 1 with the transparent electrode included, and is divided into a plurality of photovoltaic conversion layers by laser-patterning. Furthermore, a highly reflective conductive film is formed on the approximately whole surface of the substrate with the plurality of photovoltaic conversion layers and is divided into a plurality of rear surface electrodes by laser-patterning.

A normalized release voltage and normalized conversion efficiency are measured in comparison with a photovoltaic element of 1 cm$^2$ using the transparent electrode film of the same lamination as a reference. "○" indicates a normalized release voltage, "□" indicates normalized conversion efficiency in the figures.

The ZnO film of samples in FIGS. 7–10 is 2500 Å and the ITO film has various thickness.

Figure 7:
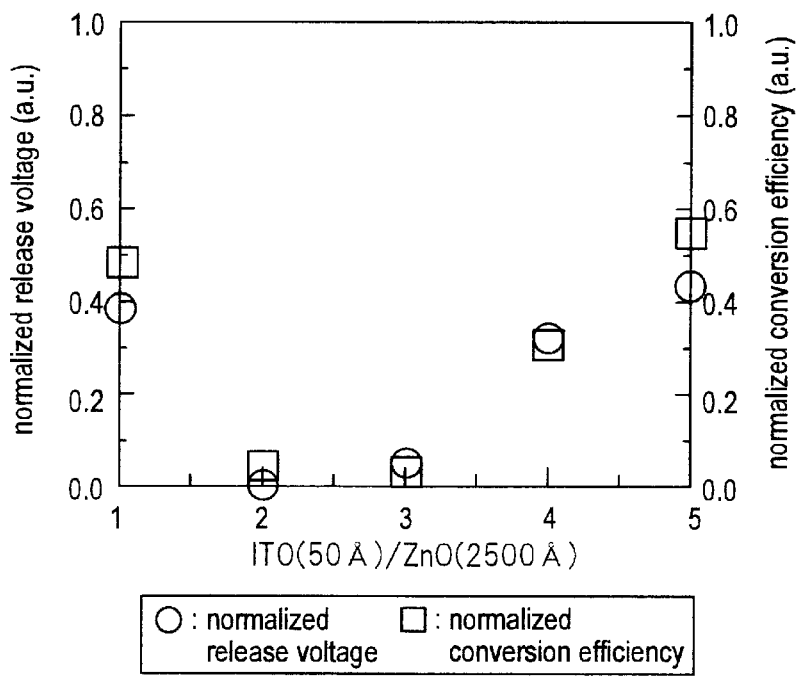
FIG. 7 is a characteristic view in measuring a normalized release voltage and normalized conversion efficiency when an ITO film is 50 Å and a ZnO film is 2500 Å.

FIG. 7 is a characteristic view in measuring a normalized release voltage and normalized conversion efficiency when the ITO film is 50 Å and the ZnO film is 2500 Å. The samples are produced by laminating the ITO film of 50 Å and the ZnO film of 2500 Å on the glass substrate and dividing the lamination film by laser patterning of the above conditions. The integrated type photovoltaic device is manufactured by using these samples and a normalized release voltage and normalized release efficiency are measured.

As shown in FIG. 7, the layers of these samples are not completely separated and short-circuit is observed.

Figure 8:
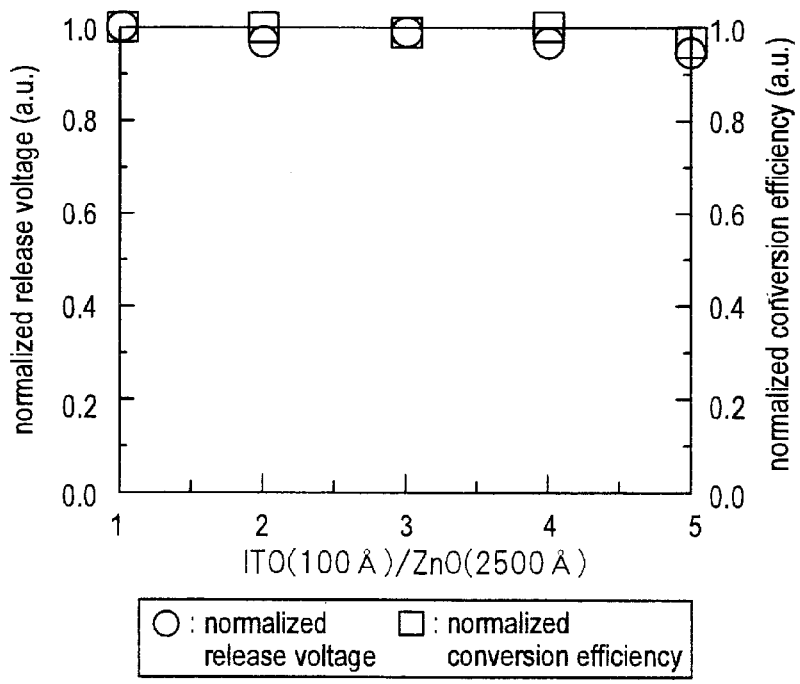
FIG. 8 is a characteristic view in measuring a normalized release voltage and normalized conversion efficiency when the ITO film is 100 Å and the ZnO film is 2500 Å.

FIG. 8 is a characteristic view in measuring a normalized release voltage and normalized conversion efficiency when the ITO film is 100 Å and the ZnO film is 2500 Å. The samples are produced by the above described processes. When the ITO film is 100 Å and the ZnO film is 2500 Å, characteristics equivalent to those of a photovoltaic element of 1 cm$^2$ can be obtained in terms of a normalized release voltage and normalized conversion efficiency. It is found that an integrated type photovoltaic device of good characteristics is provided.

Figure 9:
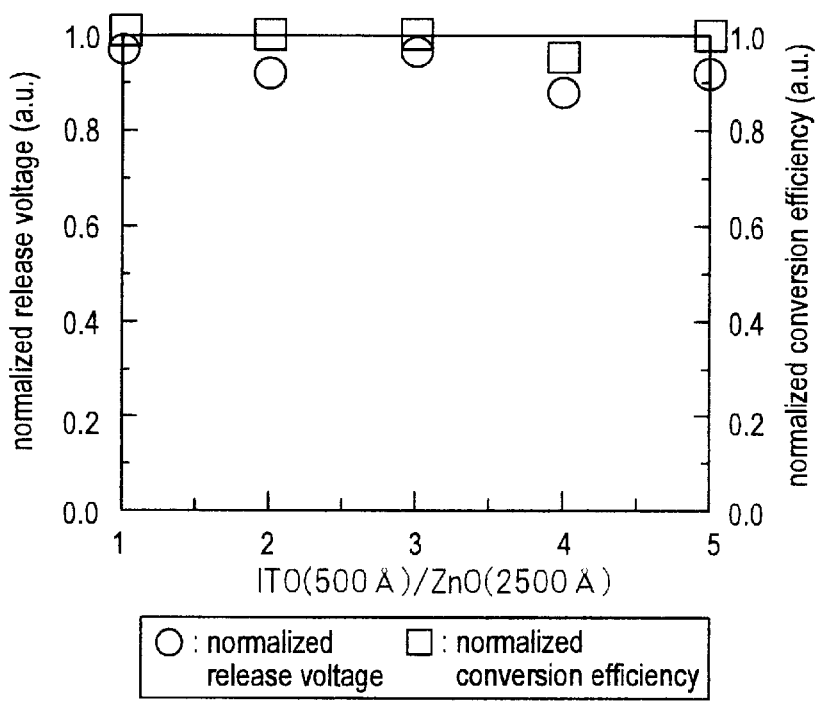
FIG. 9 is a characteristic view in measuring a normalized release voltage and normalized conversion efficiency when the ITO film is 500 Å and the ZnO film is 2500 Å.
Figure 10:
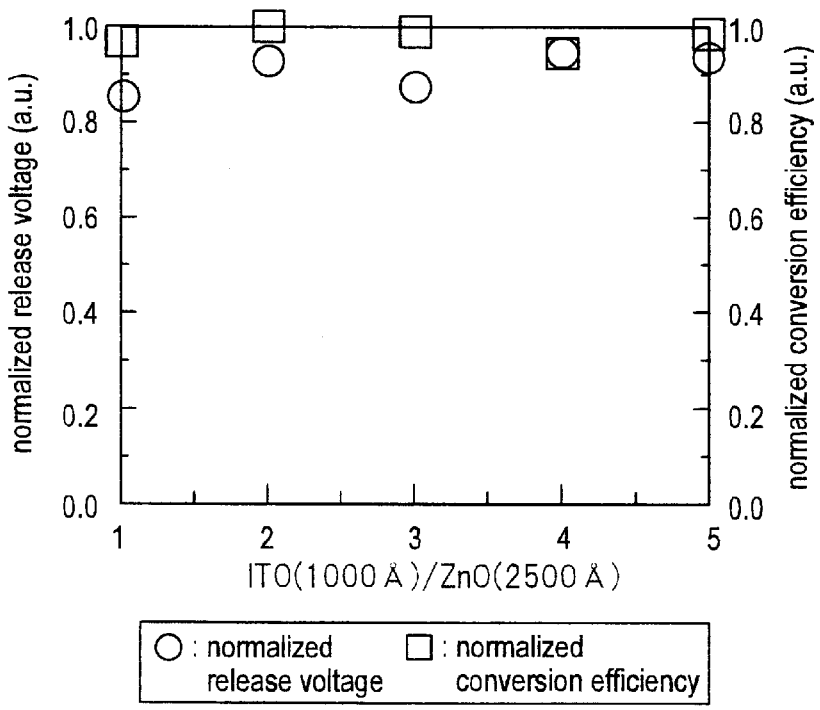
FIG. 10 is a characteristic view in measuring a normalized release voltage and normalized conversion efficiency when the ITO film is 1000 Å and the ZnO film is 2500 Å.

FIG. 9 is a characteristic view in measuring a normalized release voltage and normalized conversion efficiency when the ITO film is 500 Å and the ZnO film is 2500 Å. FIG. 10 is a characteristic view in measuring a normalized release voltage and normalized conversion efficiency when the ITO film is 1000 Å and the ZnO film is 2500 Å. The samples are produced by the above described processes. As shown in FIGS. 9, 10 good characteristics can be obtained as the integrated type photovoltaic device although a little degradation of characteristics is found as compared with FIG. 8.

The ZnO film of the samples in FIGS. 11–14 is 3000 Å and the ITO film has various thickness.

Figure 11:
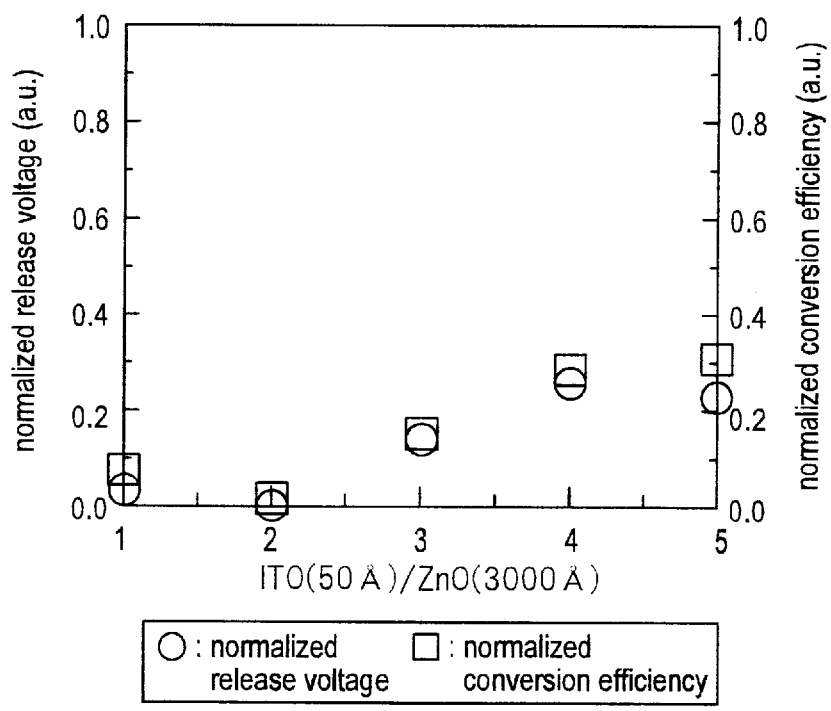
FIG. 11 is a characteristic view in measuring a normalized release voltage and normalized conversion efficiency when the ITO film is 50 Å and the ZnO film is 3000 Å.

FIG. 11 is a characteristic view in measuring a normalized release voltage and normalized conversion efficiency when the ITO film is 50 Å and the ZnO film is 3000 Å. The samples are produced by laminating the ITO film of 50 Å and the ZnO film of 3000 Å in this order on the glass substrate and dividing the lamination film by laser patterning of the above conditions. The integrated type photovoltaic device is manufactured by using these samples and a normalized release voltage and normalized release efficiency are measured.

As shown in FIG. 11, these samples are not completely separated and short-circuit is found.

Figure 12:
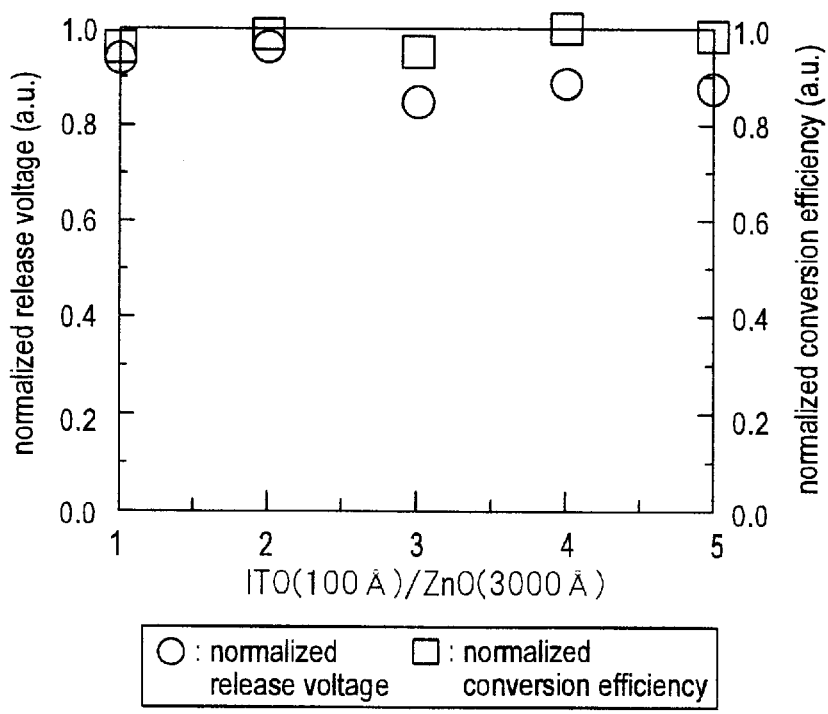
FIG. 12 is a characteristic view in measuring a normalized release voltage and normalized conversion efficiency when the ITO film is 100 Å and the ZnO film is 3000 Å.
Figure 13:
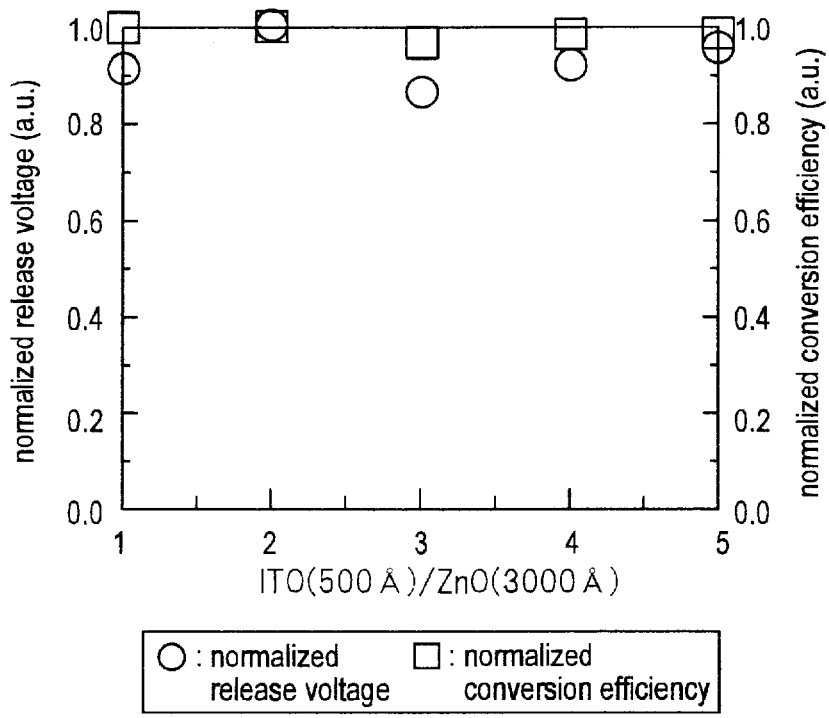
FIG. 13 is a characteristic view in measuring a normalized release voltage and normalized conversion efficiency when the ITO film is 500 Å and the ZnO film is 3000 Å.
Figure 14:
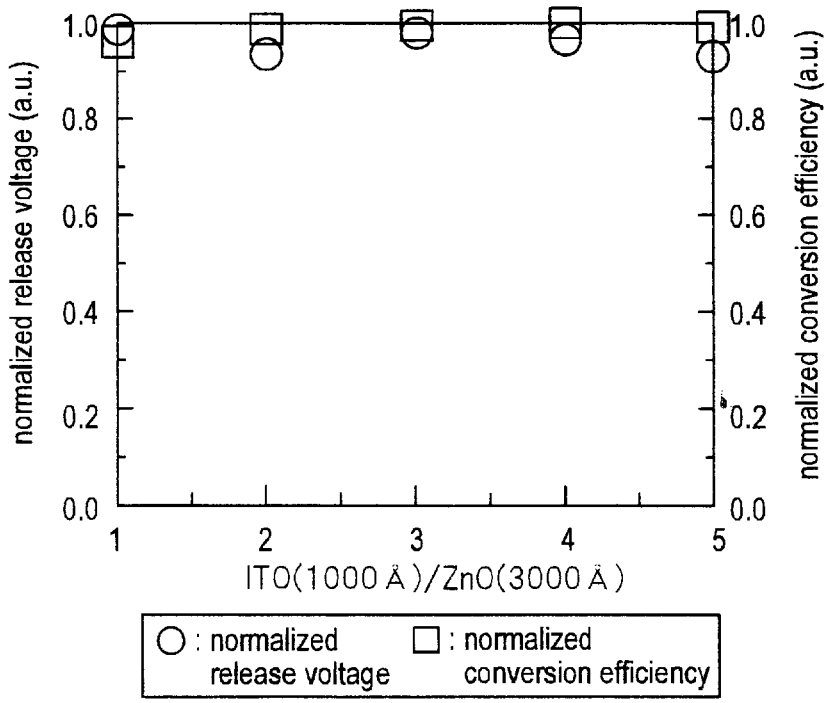
FIG. 14 is a characteristic view in measuring a normalized release voltage and normalized conversion efficiency when the ITO film is 1000 Å and the ZnO film is 3000 Å.

FIGS. 12–14 are characteristic views in measuring a normalized release voltage and normalized conversion efficiency respectively when the ITO film is 100 Å and the ZnO film is 3000 Å, when the ITO film is 500 Å and the ZnO film is 3000 Å, and when the ITO film is 1000 Å and the ZnO film is 3000 Å. The samples are produced through the above processes.

As shown in FIGS. 12–14, when the ITO film is not less than 100 Å in thickness and the ZnO film is 3000 Å, characteristics equivalent to those of a photovoltaic element of 1 cm$^2$ can be obtained in terms of a normalized release voltage and normalized conversion efficiency. It is found that an integrated type photovoltaic device of good characteristics is provided.

The ZnO film of samples in FIGS. 15–18 is 4000 Å and the ITO film has various thickness.

Figure 15:
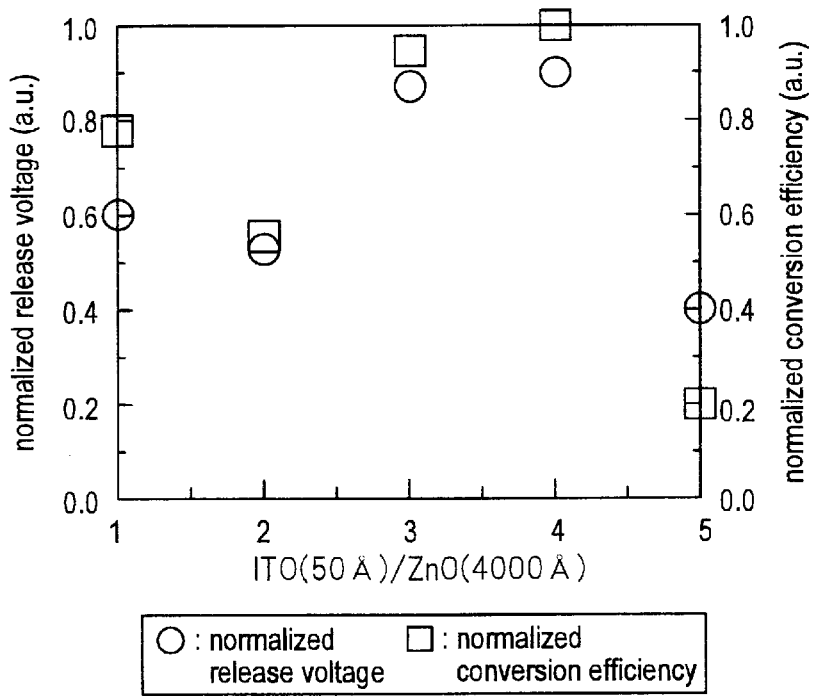
FIG. 15 is a characteristic view in measuring a normalized release voltage and normalized conversion efficiency when the ITO film is 50 Å and the ZnO film is 4000 Å.

FIG. 15 is a characteristic view in measuring a normalized release voltage and normalized conversion efficiency when the ITO film is 50 Å and the ZnO film is 4000 Å. The samples are produced by laminating the ITO film of 50 Å and the ZnO film of 4000 Å on the glass substrate and dividing the lamination film by laser patterning of the above conditions. The integrated type photovoltaic device is manufactured by using these samples and a normalized release voltage and normalized release efficiency are measured.

As shown in FIG. 15, these samples are not completely separated and short-circuit is observed.

Figure 16:
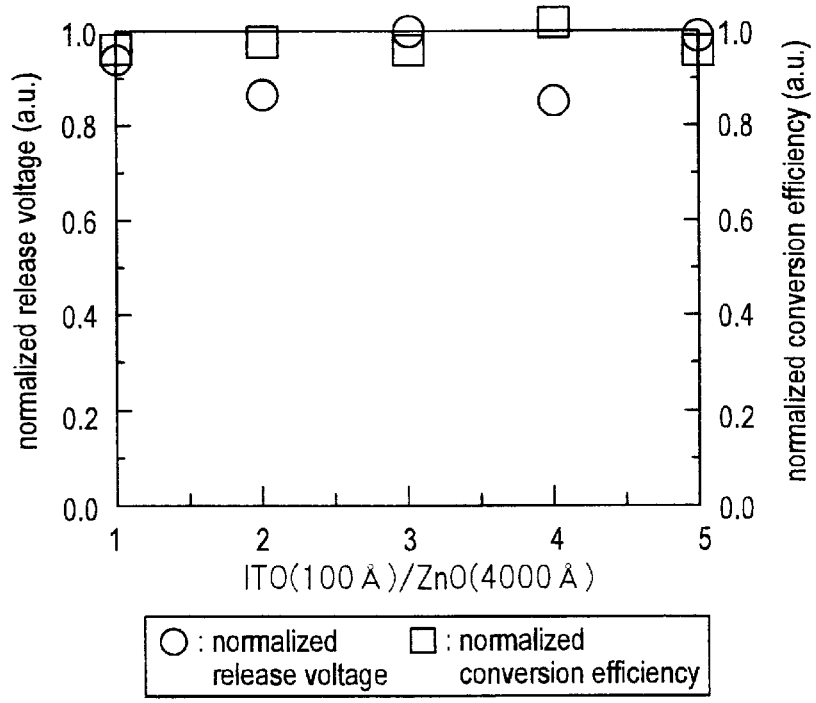
FIG. 16 is a characteristic view in measuring a normalized release voltage and normalized conversion efficiency when the ITO film is 100 Å and the ZnO film is 4000 Å.
Figure 17:
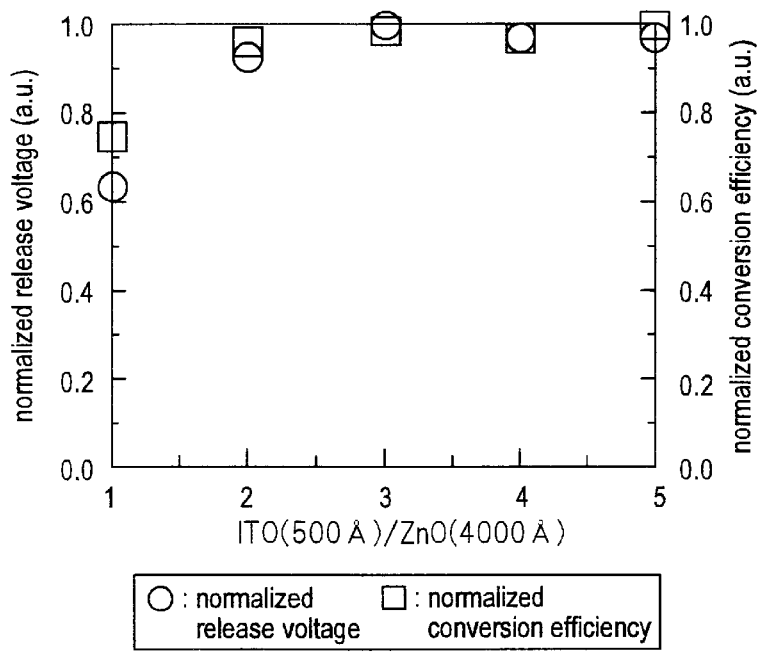
FIG. 17 is a characteristic view in measuring a normalized release voltage and normalized conversion efficiency when the ITO film is 500 Å and the ZnO film is 4000 Å.
Figure 18:
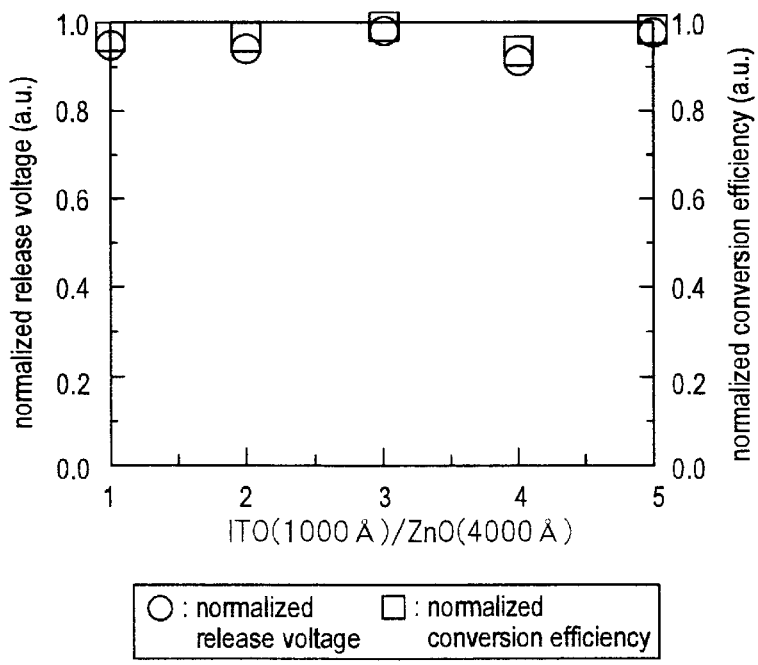
FIG. 18 is a characteristic view in measuring a normalized release voltage and normalized conversion efficiency when the ITO film is 1000 Å and the ZnO film is 4000 Å.

FIGS. 16–18 are characteristic views in measuring a normalized release voltage and normalized conversion efficiency respectively when the ITO film is 100 Å and the ZnO film is 4000 Å, when the ITO film is 500 Å and the ZnO film is 4000 Å, and when the ITO film is 1000 Å and the ZnO film is 4000 Å. The samples are formed through the above processes.

As shown in FIGS. 16–18, when the ITO film is not less than 100 Å in thickness and the ZnO film is 4000 Å, characteristics equivalent to those of a photovoltaic element of 1 cm$^2$ can be obtained in terms of a normalized release voltage and normalized conversion efficiency. It is found that an integrated type photovoltaic device of good characteristics is provided.

The ZnO film of samples in FIGS. 19–22 is 5000 Å and the ITO film has various thickness.

Figure 19:
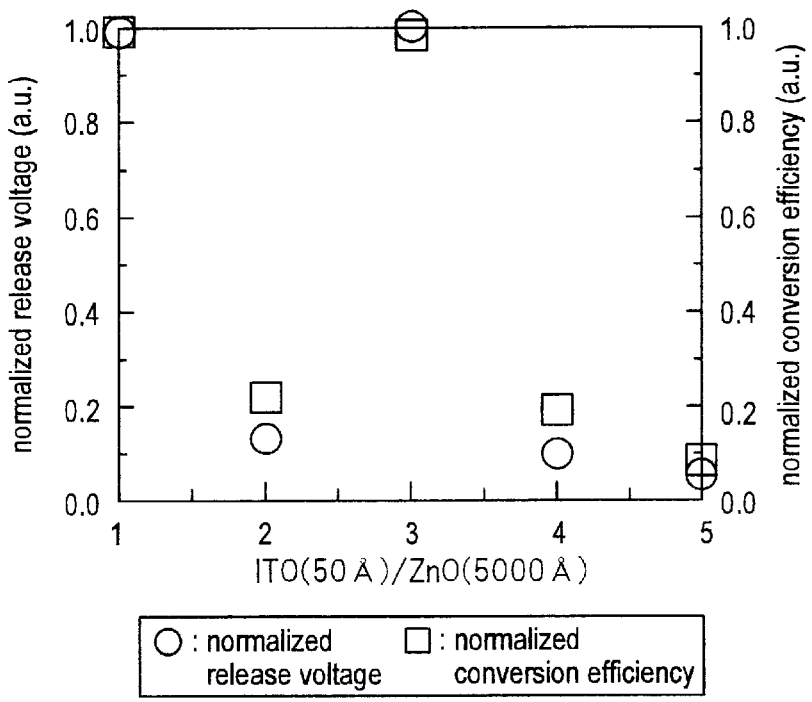
FIG. 19 is a characteristic view in measuring a normalized release voltage and normalized conversion efficiency when the ITO film is 50 Å and the ZnO film is 5000 Å.

FIG. 19 is a characteristic view in measuring a normalized release voltage and normalized conversion efficiency when the ITO film is 50 Å and the ZnO film is 5000 Å. The samples are produced by laminating the ITO film of 50 Å and the ZnO film of 5000 Å on the glass substrate and dividing the lamination film by laser patterning of the above conditions. The integrated type photovoltaic device is manufactured by using these samples and a normalized release voltage and normalized release efficiency are measured.

As shown in FIG. 19, these samples are not completely separated and short-circuit is observed.

Figure 20:
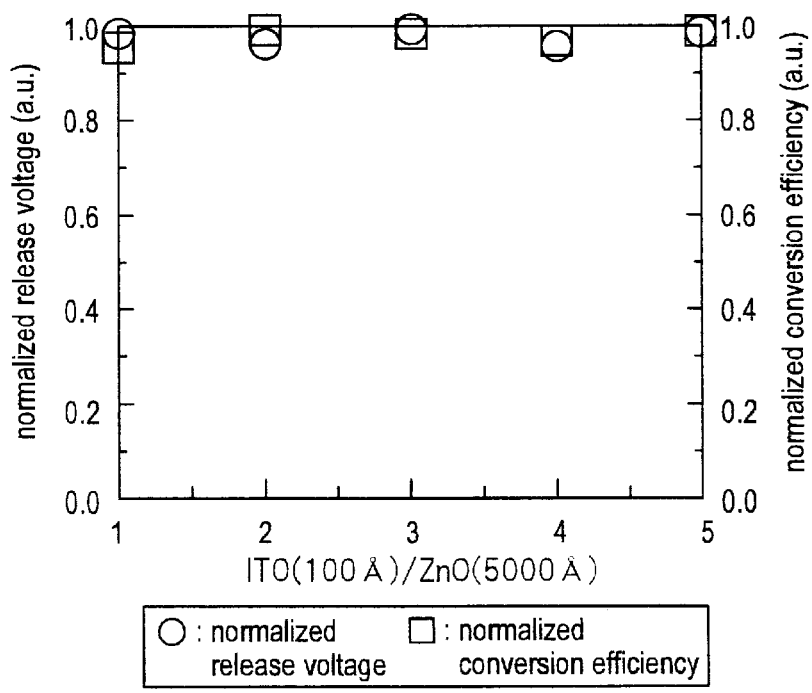
FIG. 20 is a characteristic view showing a normalized release voltage and normalized conversion efficiency when the ITO film is 100 Å and the ZnO film is 5000 Å.
Figure 21:
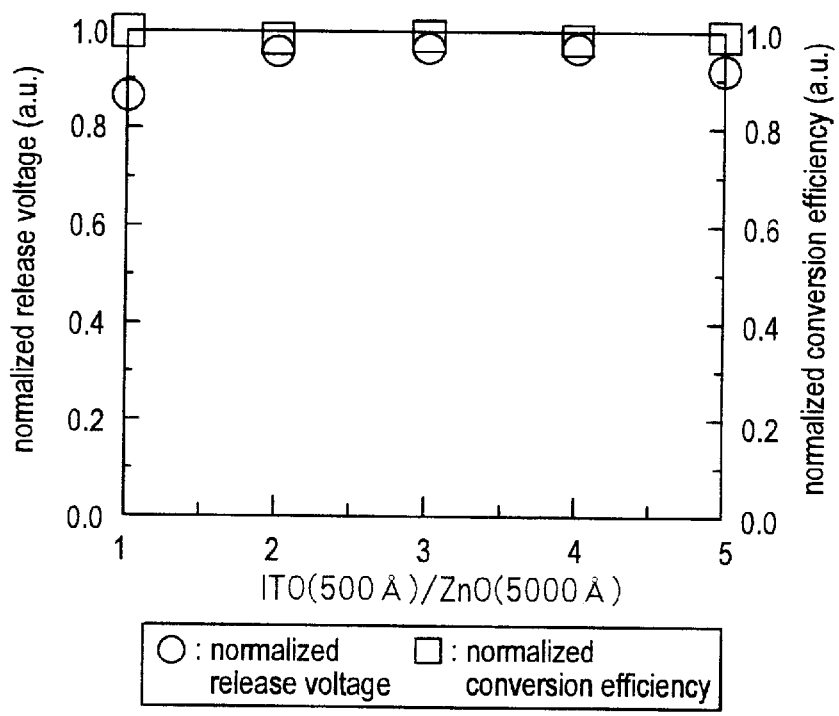
FIG. 21 is a characteristic view in measuring a normalized release voltage and normalized conversion efficiency when the ITO film is 500 Å and the ZnO film is 5000 Å.
Figure 22:
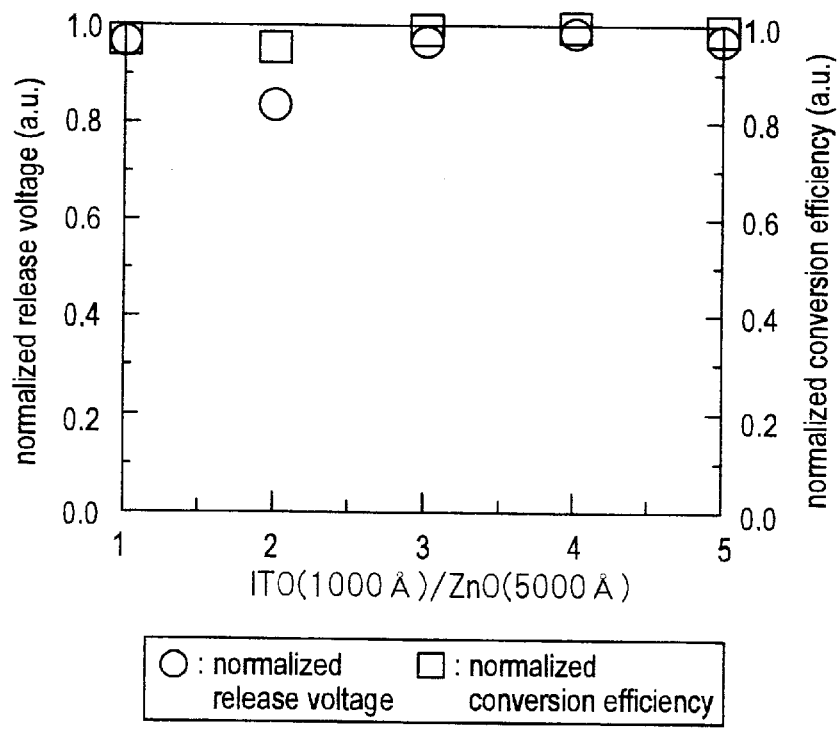
FIG. 22 is a characteristic view in measuring a normalized release voltage and normalized conversion efficiency when the ITO film is 1000 Å and the ZnO film is 5000 Å.

FIGS. 20–22 are characteristic views in measuring a normalized release voltage and normalized conversion efficiency respectively when the ITO film is 100 Å and the ZnO film is 5000 Å, when the ITO film is 500 Å and the ZnO film is 5000 Å, and when the ITO film is 1000 Å and the ZnO film is 5000 Å. The samples are produced through the above processes.

As shown in FIGS. 20–22, when the ITO film is not less than 100 Å in thickness and the ZnO film is 5000 Å, characteristics equivalent to those of a photovoltaic element of 1 cm² can be obtained in terms of a normalized release voltage and normalized conversion efficiency. It is found that an integrated type photovoltaic device of good characteristics is provided.

As shown in FIGS. 7–22, advantages of this invention can be obtained when the transparent electrode film having lamination of the ITO film and the ZnO film has the thickness of ITO not less than 100 Å. When the thickness of the ITO is 1000 Å, the integrated type photovoltaic device of good characteristics is provided. Although the integrated type photovoltaic device of good characteristic is obtained even when the ITO film is not less than 1000 Å in thickness, the thickness of the ITO is preferred to be 100–1000 Å in terms of manufacturing cost. In addition, when the thickness of the ZnO is 2500–5000 Å, the integrated type photovoltaic device of good characteristics is provided.

Figure 23:
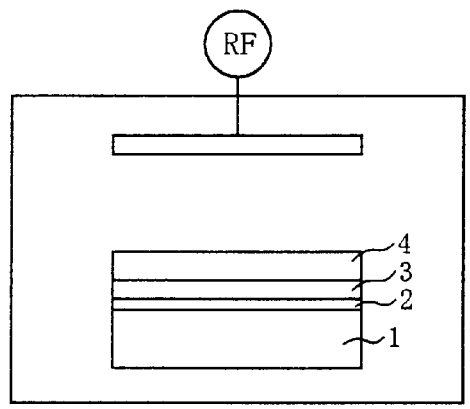
FIG. 23 is a schematic view of a transparent electrode formed by sputtering.

It is generally known that ZnO material has moisture absorption property. Therefore when the ZnO film is retained in the atmosphere for longer than one day, moisture in the atmosphere penetrates from a surface of the ZnO film and solid state properties change, resulting in significant laser patterning failure. As shown in FIG. 23, the ITO film 3 is formed by sputtering on the glass substrate 1 with the crystallized glass layer 2 formed thereon. After forming the ZnO film 4 on the ITO film 3 by sputtering, it is exposed in a nitrogen atmosphere, and a moisture proof layer containing nitrogen of a nitrogen diffused layer or an absorbing layer is formed on the surface of the ZnO film 4.

Figure 24:
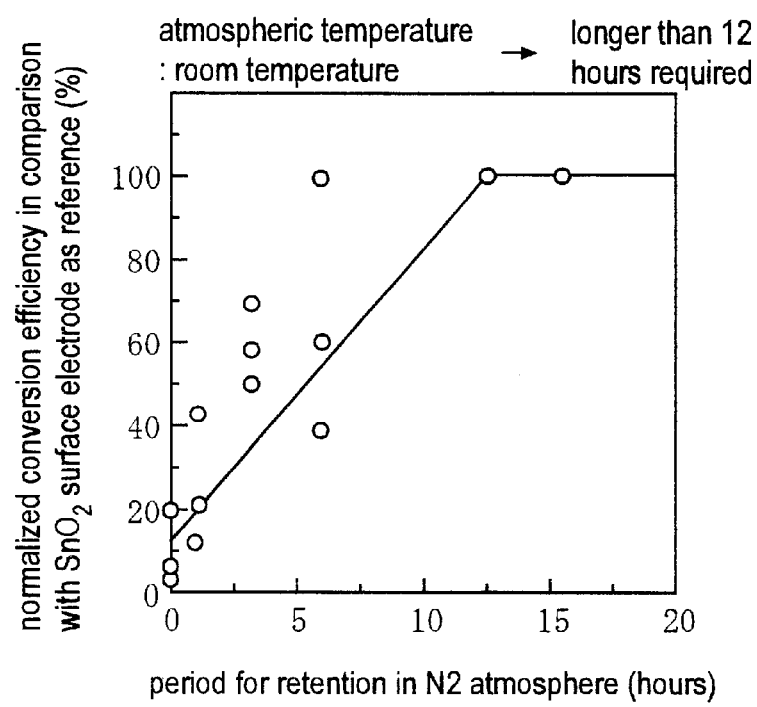
FIG. 24 is a diagram indicating relations between exposure time and normalized conversion efficiency at a certain atmospheric nitrogen temperature in exposure.
Figure 25:
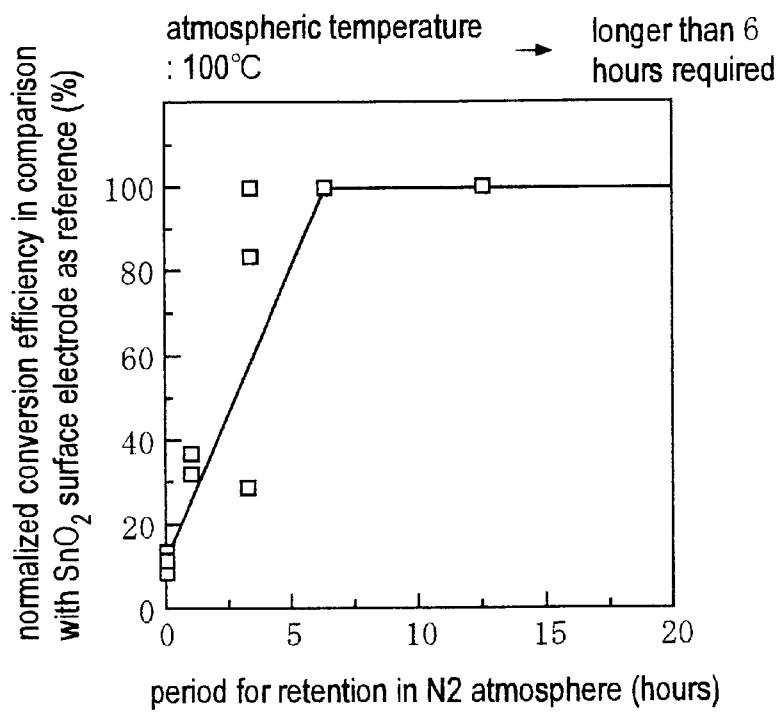
FIG. 25 is a diagram indicating relations between exposure time and normalized conversion efficiency at a certain atmospheric nitrogen temperature in exposure.
Figure 26:
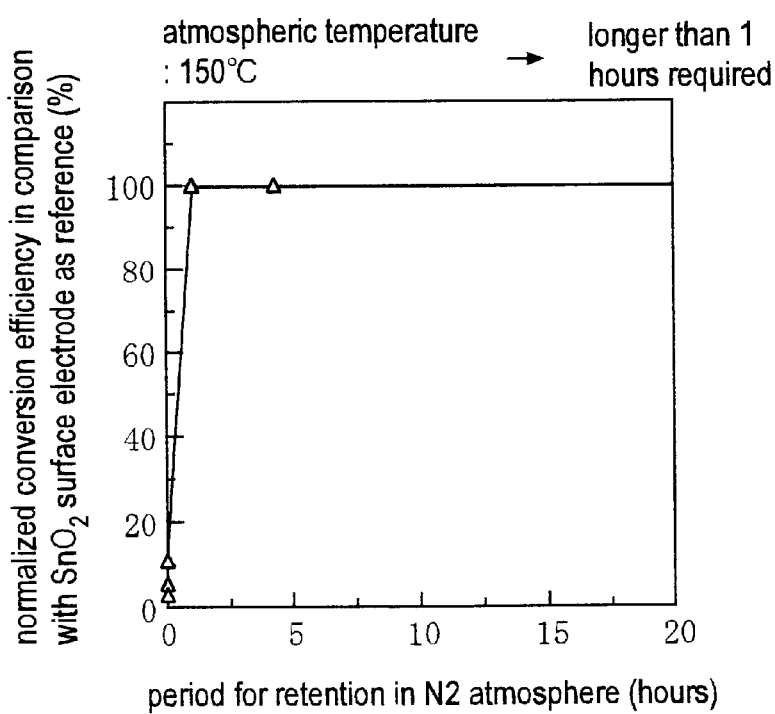
FIG. 26 is a diagram indicating relations between exposure time and normalized conversion efficiency at a certain atmospheric nitrogen temperature in exposure.

A desired moisture proof layer formed on the surface of the ZnO film 4 is exposed for different time depending on a substrate temperature. In FIG. 24, an atmospheric temperature is a room temperature, and an effect of the moisture proof layer is not obtained unless the film is exposed for longer than 12 hours. In FIG. 25, an atmospheric temperature is 100° C., and an effect of the moisture proof layer is not obtained unless the film is exposed for longer than 6 hours. In FIG. 26, an atmospheric temperature is 150° C., and an effect of the moisture proof layer can not appear unless the film is exposed for longer than one hours. In FIGS. 24–26, normalized conversion efficiency is indicated when the photovoltaic element formed on the transparent electrode film is used as an $SnO_2$ surface electrode as a reference.

The moisture proof layer prevents penetration of moisture from the surface of the ZnO film and prevents degradation of workability of laser-patterning or the like. In addition, long-term reliability of the ZnO film can be improved.

In the above embodiment, the ITO film having a lower melting point is provided on a side far from a surface to be irradiated with a laser. The transparent film having a lower melting point than that of the ZnO film and having a thickness so as not to degrade the light transmittivity significantly, can provid the same effect even when any other metal thin film is used. For example, silver (Ag), aluminum (Al) or the like can be used. A minimum and maximum value of thickness for not degrading light transmittivity and obtaining the effect of this invention are obtained experimentally. Samples are produced as in the case of the ITO film and experiments are conducted.

A crystallized glass layer 2 of 50 Å is formed on a transparent glass substrate 1, an Ag or Al film 3 and a ZnO film 4 are formed on the crystallized glass layer 2. A thickness of each of the layers are different in each of the different samples. The substrates are patterned with an Nd:YAG laser and an integrated type photovoltaic device is manufactured by using this substrate.

A normalized release voltage and a normalized conversion efficiency are measured in comparison with a photovoltaic element of 1 cm² using the transparent electrode film of ZnO element of 5000 Å. In these figures, "○" indicates a normalized release voltage, "□" indicates a normalized conversion efficiency.

The samples in FIGS. 27–30 have the ZnO film of 5000 Å and the Ag film of different thickness.

Figure 27:
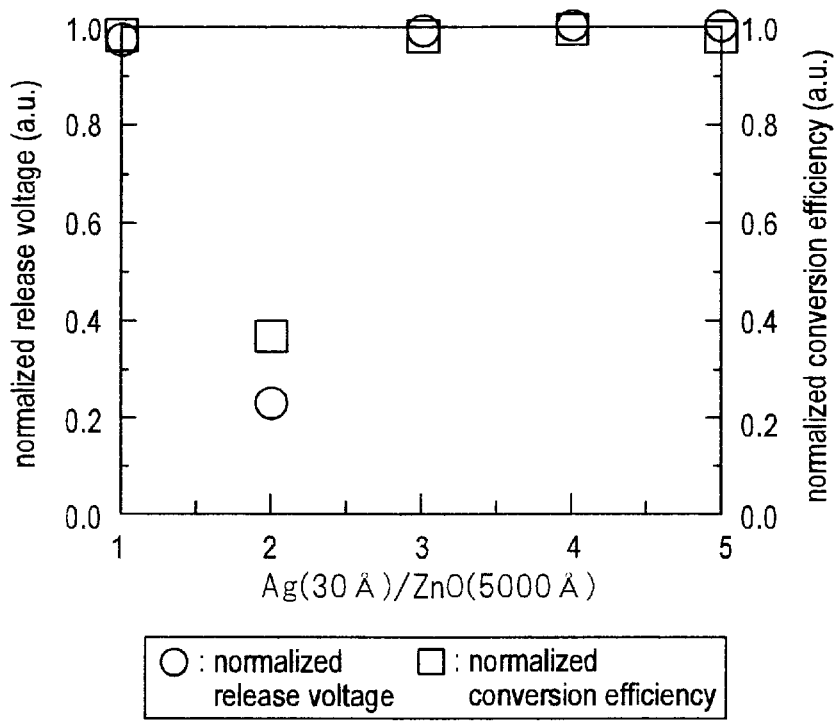
FIG. 27 is a characteristic view in measuring a normalized release voltage and normalized conversion efficiency measured when the Ag film is 30 Å and the ZnO film is 5000 Å.

FIG. 27 is a characteristic view in measuring a normalized release voltage and normalized conversion efficiency when the Ag film is 30 Å and the ZnO film is 5000 Å. These samples are formed by laminating the Ag film of 30 Å and the ZnO film of 5000 Å in this order on the glass substrate and the lamination is divided by laser patterning under the above conditions. The integrated type photovoltaic device is manufactured by using these samples and a normalized release voltage and normalized release efficiency are measured.

As shown in FIG. 27, the normalized release voltage and normalized conversion efficiency of the sample 2 are degraded significantly, and the layers are not completely divided, resulting in occurrence of short-circuit.

Figure 28:
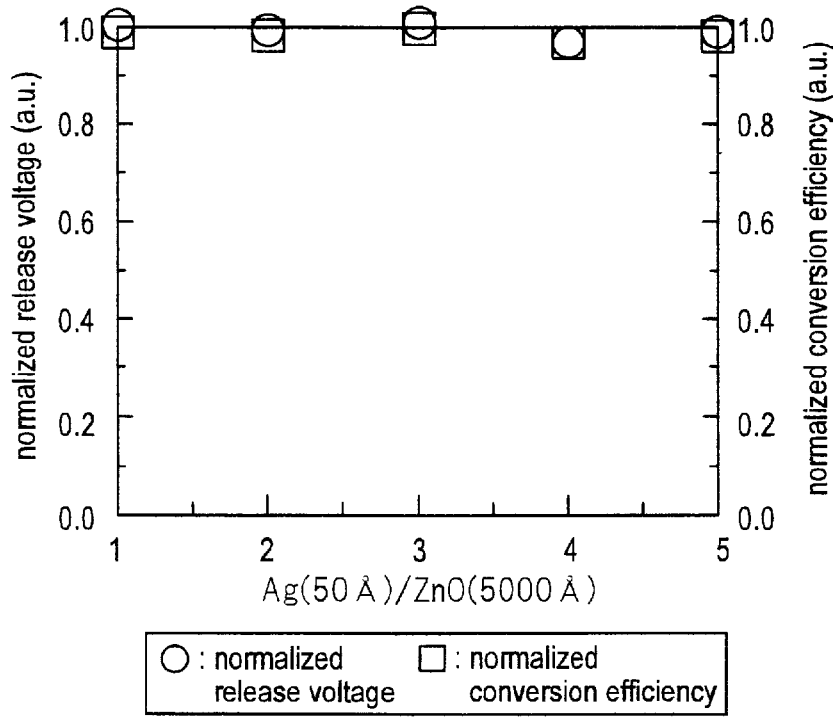
FIG. 28 is a characteristic view in measuring a normalized release voltage and normalized conversion efficiency measured when the Ag film is 50 Å and the ZnO film is 5000 Å.

FIG. 28 is a characteristic view in measuring a normalized release voltage and normalized conversion efficiency when the Ag film is 50 Å and the ZnO film is 5000 Å. Samples are produced through the above processes. As shown in FIG. 28, when the Ag film is 50 Å and the ZnO film is 5000 Å, characteristics equivalent to those of a photovoltaic element of 1 cm² can be obtained in terms of a normalized release voltage and normalized conversion efficiency. It is found that an integrated type photovoltaic device of good characteristics is provided.

Figure 29:
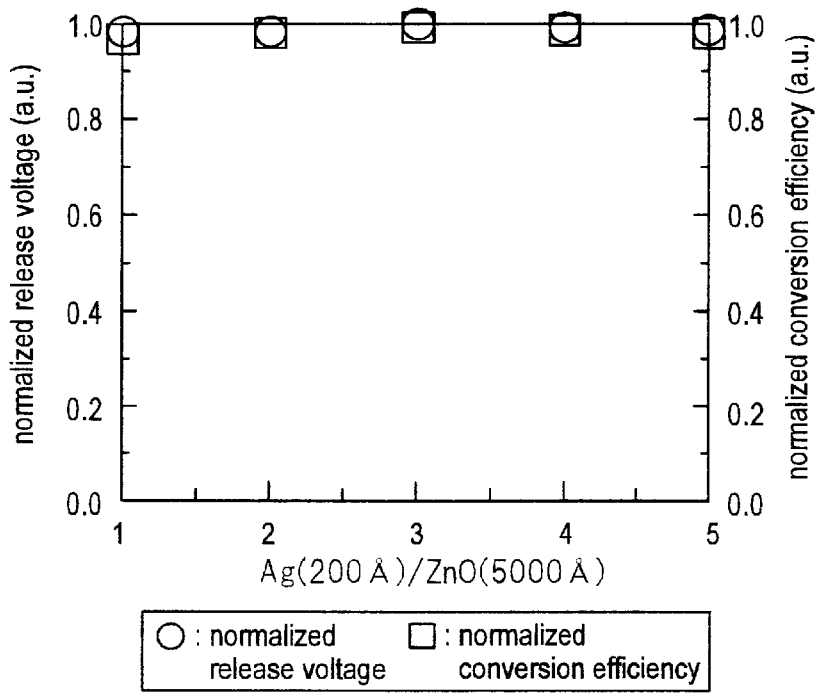
FIG. 29 is a characteristic view in measuring a normalized release voltage and normalized conversion efficiency measured when the Ag film is 200 Å and the ZnO film is 5000 Å.

FIG. 29 is a characteristic view in measuring a normalized release voltage and normalized conversion efficiency when the Ag film is 200 Å and the ZnO film is 5000 Å. The samples are produced through the above processes. As shown in FIG. 29, when the Ag film is not less than 200 Å and the ZnO film is 5000 Å, characteristics equivalent to a photovoltaic element of 1 cm² can be obtained in terms of a normalized release voltage and normalized conversion efficiency. It is found that an integrated type photovoltaic device of good characteristics is provided.

Figure 30:
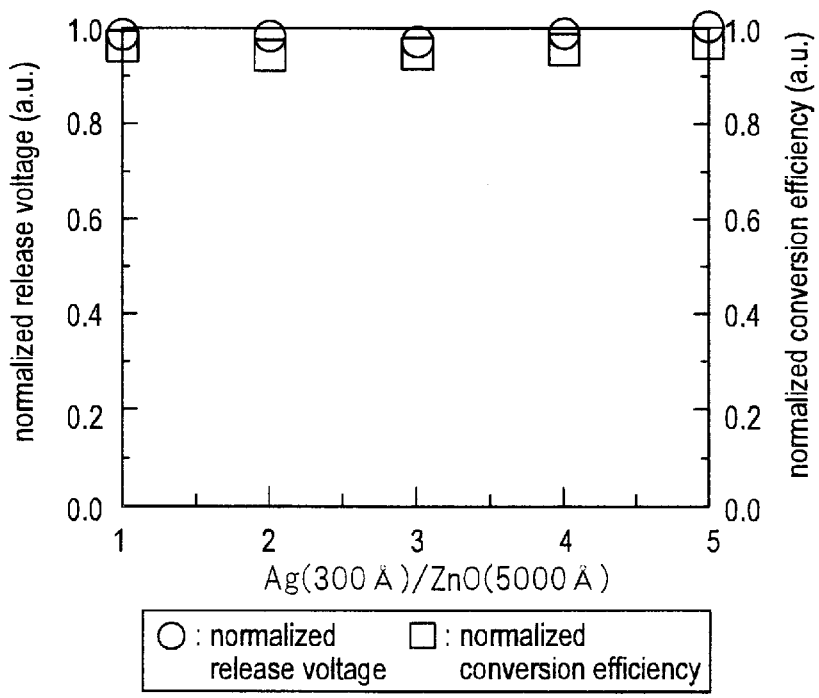
FIG. 30 is a characteristic view in measuring a normalized release voltage and normalized conversion efficiency measured when the Ag film is 300 Å and the ZnO film is 5000 Å.

FIG. 30 is a characteristic view in measuring a normalized release voltage and normalized conversion efficiency when the Ag film is 300 Å and the ZnO film is 5000 Å. Samples are produced through the above processes. As shown in FIG. 30, characteristics of the normalized conversion efficiency are degraded a little as compared with FIGS. 28, 29. This seems because the thickness of the Ag film increases and light transmittivity is degraded a little. However, an integrated type photovoltaic device of good characteristics is provided in spite of a little degradation of conversion efficiency.

It is found, from FIGS. 27–30, that the Ag film of 50–300 Å, preferably 50–200 Å is desirable in the transparent electrode film with the Ag film and the ZnO film laminated.

Explanation is made on samples using an Al film as a metal thin film.

The samples in FIGS. 31–34 have a ZnO film of 5000 Å and an Al film of different thickness.

Figure 31:
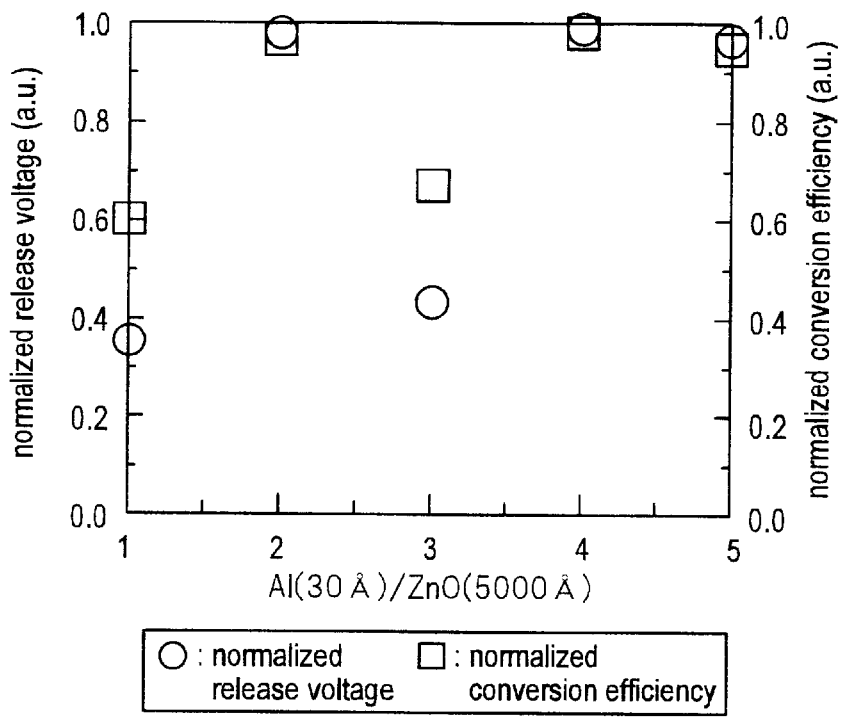
FIG. 31 is a characteristic view in measuring a normalized release voltage and normalized conversion efficiency measured when the Al film is 30 Å and the ZnO film is 5000 Å.

FIG. 31 is a characteristic view in measuring a normalized release voltage and normalized conversion efficiency when the Al film is 30 Å and the ZnO film is 5000 Å. These samples are formed by laminating the Al film of 30 Å and the ZnO film of 5000 Å in this order on the glass substrate and the lamination is divided by laser patterning under the above conditions. The integrated type photovoltaic device is manufactured by using these samples and a normalized release voltage and normalized release efficiency are measured.

As shown in FIG. 31, the normalized release voltage and normalized conversion efficiency of the sample 1, 3 are degraded significantly, and the layers are not sufficiently divided, resulting in occurrence of short-circuit.

Figure 32:
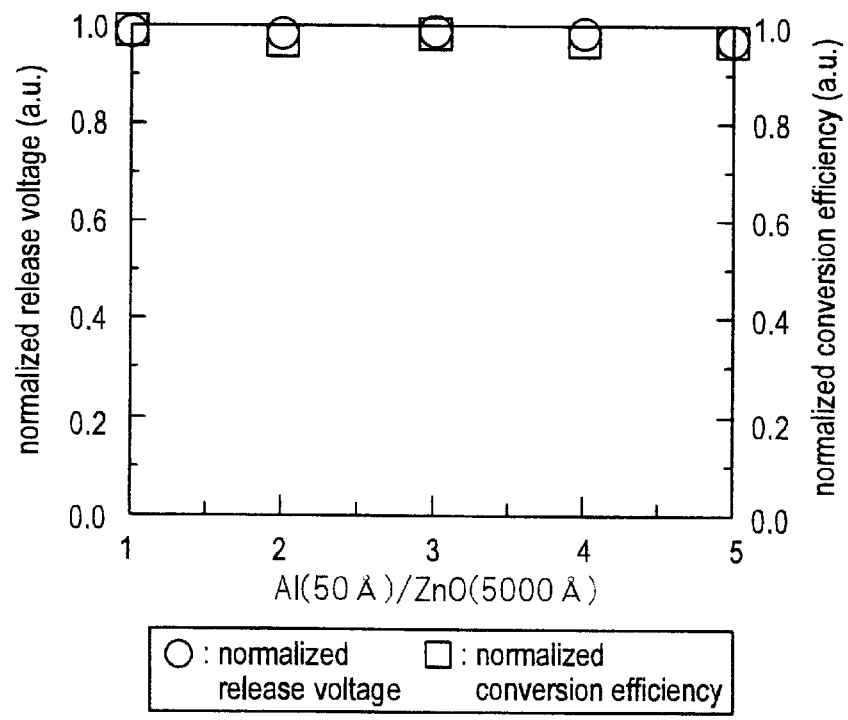
FIG. 32 is a characteristic view in measuring a normalized release voltage and normalized conversion efficiency measured when the Al film is 100 Å and the ZnO film is 5000 Å.

FIG. 32 is a characteristic view in measuring a normalized release voltage and normalized conversion efficiency when the Al film is 50 Å and the ZnO film is 5000 Å. Samples are produced through the above processes. As shown in FIG. 32, when the Al film is not less than 50 Å and the ZnO film is 5000 Å, characteristics equivalent to those of a photovoltaic element of 1 cm$^2$ can be obtained in terms of a normalized release voltage and normalized conversion efficiency. It is found that an integrated type photovoltaic device of good characteristics is provided.

Figure 33:
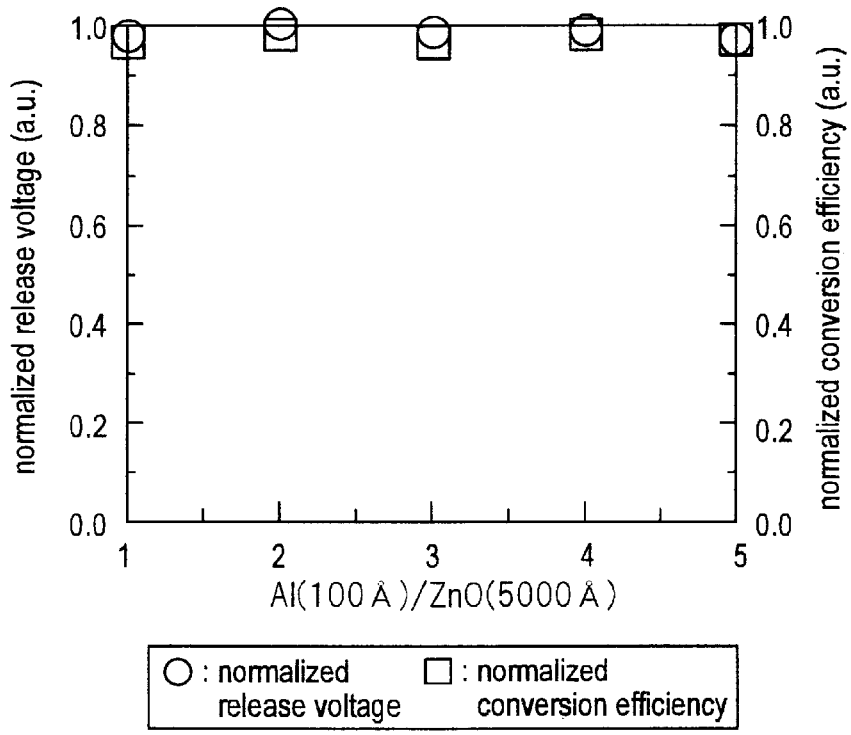
FIG. 33 is a characteristic view in measuring a normalized release voltage and normalized conversion efficiency measured when the Al film is 30 Å and the ZnO film is 5000 Å.

FIG. 33 is a characteristic view in measuring a normalized release voltage and normalized conversion efficiency when the Al film is 100 Å and the ZnO film is 5000 Å. Samples are produced through the above processes. As shown in FIG. 33, when the Al film is not less than 100 Å and the ZnO film is 5000 Å, characteristics equivalent to those of a photovoltaic element of 1 cm$^2$ can be obtained in terms of a normalized release voltage and normalized conversion efficiency. It is found that an integrated type photovoltaic device of good characteristics is provided.

Figure 34:
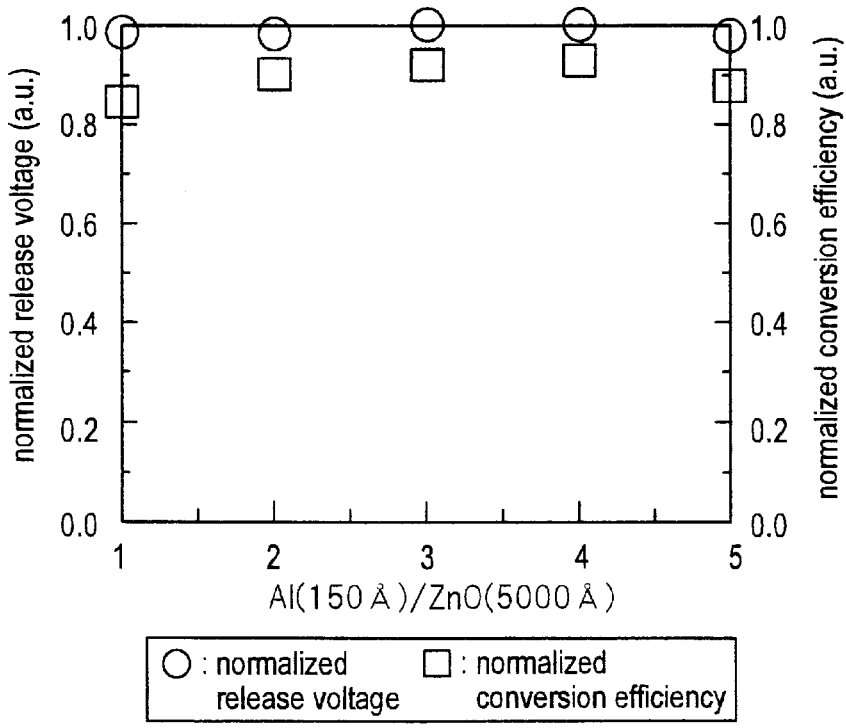
FIG. 34 is a characteristic view in measuring a normalized release voltage and normalized conversion efficiency measured when the Al film is 150 Å and the ZnO film is 5000 Å.
Figure 35:
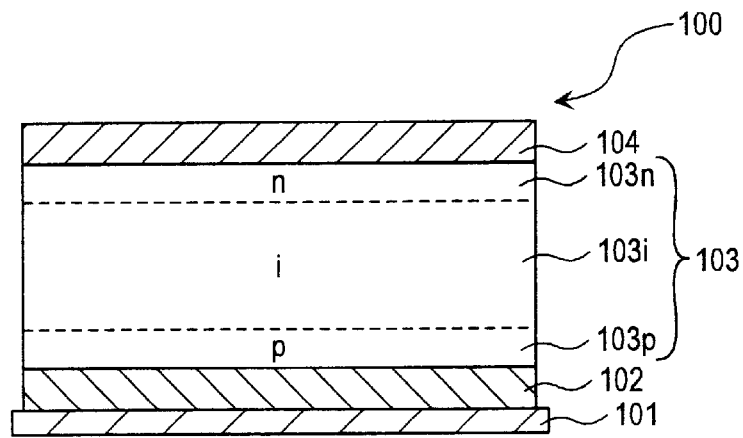
FIG. 35 is a cross sectional view illustrating a general amorphous photovoltaic device.

FIG. 34 is a characteristic view in measuring a normalized release voltage and normalized conversion efficiency when the Al film is 150 Å and the ZnO film is 5000 Å. Samples are produced through the above processes. As shown in FIG. 34, characteristics of the normalized conversion efficiency are degraded a little as compared with in FIGS. 32, 33. This seems because the thickness of the Al film increases and light transmittivity is degraded a little.

It is preferred, as shown in FIGS. 31–34, the thickness of the Al film is 50–100 Å in the transparent electrode film with the Al film and the ZnO film laminated.

As described above, the transparent conductive thin film having a lower melting point than that of the ZnO film is provided on a side apart from the surface to be irradiated with a laser, thus injection of excessive laser energy higher than the melting point of the material becomes unnecessary, resulting in suppression of heat damage (volume expansion, a crack) on the end part to be irradiated with a laser.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A transparent electrode formed by patterning a transparent electrode film formed on a transparent substrate with a laser comprising a transparent electrode film having a lower melting point than that of a ZnO film and the ZnO film laminated in this order on the transparent substrate, wherein the ZnO film is directly laminated on the transparent electrode film, the transparent electrode film and the ZnO film are patterned by laser irradiation, and the transparent electrode film having the lower melting point than that of the ZnO film is an ITO film.

2. The transparent electrode according to claim 1, wherein the ITO film is 100–1000 Å, and the ZnO film is 2500–5000 Å.

3. The transparent electrode according to claim 1, wherein a moisture proof layer containing nitrogen is formed on a surface of the ZnO film.

* * * * *